United States Patent
Sohn

(10) Patent No.: US 7,848,164 B2
(45) Date of Patent: Dec. 7, 2010

(54) SEMICONDUCTOR MEMORY DEVICE HAVING REDUNDANCY MEMORY BLOCK AND CELL ARRAY STRUCTURE THEREOF

(75) Inventor: Kyo-Min Sohn, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 12/204,194

(22) Filed: Sep. 4, 2008

(65) Prior Publication Data
US 2009/0080273 A1 Mar. 26, 2009

(30) Foreign Application Priority Data
Sep. 21, 2007 (KR) .................. 10-2007-0096287

(51) Int. Cl.
*G11C 7/00* (2006.01)
(52) U.S. Cl. .............. 365/200; 365/230.03; 365/230.06
(58) Field of Classification Search .......... 365/200, 365/230.03, 230.06
See application file for complete search history.

(56) References Cited
U.S. PATENT DOCUMENTS

| | | | | |
|---|---|---|---|---|
| 4,837,747 A | * | 6/1989 | Dosaka et al. ............. | 714/711 |
| 5,060,197 A | * | 10/1991 | Park et al. ................ | 365/200 |
| 5,124,948 A | * | 6/1992 | Takizawa et al. .......... | 365/200 |
| 5,355,339 A | * | 10/1994 | Oh et al. ................. | 365/200 |
| 6,532,181 B2 | * | 3/2003 | Saito et al. .............. | 365/200 |
| 6,728,149 B2 | * | 4/2004 | Akamatsu ................ | 365/200 |

FOREIGN PATENT DOCUMENTS

| JP | 20010344989 | 12/2001 |
|---|---|---|
| KR | 10-2002-0057342 | 7/2002 |
| KR | 10-2007-0000724 | 1/2007 |

* cited by examiner

*Primary Examiner*—Connie C Yoha
(74) *Attorney, Agent, or Firm*—F. Chau & Associates, LLC

(57) ABSTRACT

A semiconductor memory device having a redundancy memory block and a cell array structure thereof, the semiconductor memory device having a plurality of sub-mats constituting a memory cell array, wherein each of the plurality of sub-mats includes a plurality of normal memory blocks of which each includes a plurality of normal memory cells and that are disposed adjacent one another; and at least one redundancy memory block having the same structure as the plurality of normal memory blocks, being disposed adjacent at least one of the plurality of normal memory blocks and having a plurality of redundancy memory cells for a row and column repair, thereby enhancing a redundancy efficiency.

18 Claims, 7 Drawing Sheets

SEMICONDUCTOR MEMORY DEVICE HAVING REDUNDANCY MEMORY BLOCK AND CELL ARRAY STRUCTURE THEREOF

CROSS REFERENCE TO RELATED APPLICATION

This application claims priority under 35 U.S.C. §119 from Korean Patent Application 10-2007-0096287, filed on Sep. 21, 2007, the contents of which are hereby incorporated by reference in their entirety for all purposes as if fully set forth herein.

BACKGROUND

1. Technical Field

The present disclosure relates to semiconductor memory devices and, more particularly, to a semiconductor memory device having a redundancy memory block and a cell array structure thereof, which is advantageous from the standpoint of flexibility and is capable of lessening a design overhead and permitting an efficient repair.

2. Discussion of Related Art

In general, the fabrication of a semiconductor memory device is completed in a wafer state, and respective memory chips on the wafer undergo various tests. A test to check whether circuit devices of respective memory chips operate according to a predetermined specification is necessarily performed. In the test, various electrical characteristics and operations for the chips are tested through diverse test parameters. When any one of the control circuits within a semiconductor memory chip is defective based on the test result, a repair of the defective semiconductor memory device is actually impossible, but when a memory cell within a memory cell array is defective, the defective memory cell can be replaced with a redundancy memory cell through the repair process, that is, the repair of a detected defect is valid. In other words, when a portion of normal memory cells is decided as being defective, the repair may be performed by using a redundancy memory cell provided as an extra, thus permitting normal operation of the semiconductor memory device.

Redundancy memory cells provided as extra memory cells are required to repair defective memory cells in a large capacity semiconductor memory device. In this case, when a normal memory cell has a defect and the repair therefore is performed by using a redundancy memory cell, a speed slowdown problem may occur, and this may seriously influence the performance and operation of the device. Various schemes to solve such a problem have been proposed.

FIG. 1 illustrates a memory cell array structure according to conventional art.

As shown in FIG. 1, a general semiconductor memory device, particularly a memory cell array of SRAM, comprises a plurality of mats, including a plurality of sub-mats 10. As used herein, a memory mat may be thought of as a memory bank and a sub-mat as a memory sub-bank. The sub-mat 10 comprises a plurality of normal memory blocks MB, a plurality of normal sub-row decoders SRD, and one normal main row decoder MRD. The plurality of normal memory blocks MB are arrayed in a line, and a normal sub-row decoder SRD is disposed between mutually adjacent normal memory blocks MB. The normal main row decoder MRD is disposed near an edge of a normal memory block MB located at the end of the line.

The semiconductor memory device is provided with a structure in which one normal main word line MWL is selected by the normal main row decoder MRD and at least one sub-word line SWL is enabled by the normal sub-row decoder SRD responding to a signal that is provided through the normal main word line MWL. Though not shown in the drawings, related-circuits including a normal column decoder for enabling a column or bit line are disposed in each normal memory block.

FIG. 2 illustrates a layout example of redundancy cells for the repair of a normal memory cell having a defect in a semiconductor memory device with the structure described above according to a conventional art.

As shown in FIG. 2, a memory cell array structure 20 in a conventional semiconductor memory device further comprises redundancy cell areas RCA and RRA for a repair. The redundancy cell areas RCA and RRA are provided as an additional configuration, that is, a redundancy column area RCA for a column line repair and a redundancy row area RRA for a row line repair are provided.

The redundancy column area RCA is disposed near an edge of a normal memory block MB of a line of mutually adjacent normal memory cell blocks MB, and is disposed so that a redundancy column line has the same length as a column line of normal memory block MB. The redundancy row area RRA is disposed so that a redundancy row line is longer than or equal to a length of a normal main word line MWL shown in FIG. 1. Further, the redundancy row area RRA is formed being disposed in a lower part of an area to connect between all of the plurality of normal memory blocks MB disposed adjacent one another in a given direction.

The repair using the redundancy column area RCA is performed by a specific redundancy column decoder (not shown). The redundancy row area RRA also requires a specific redundancy sub-row decoder (not shown) to repair a row line corresponding to an MWL.

In the conventional cell array structure described above, the redundancy column area RCA and the redundancy row area RRA are separated from each other. Therefore, when a number of repairs for the column lines or row lines are required, the redundancy efficiency falls. That is, it is disadvantageous from the standpoint of flexibility. Furthermore, the redundancy row area RRA has a structural difference from a normal memory block MB, thus causing increased design overhead.

SUMMARY OF THE INVENTION

Accordingly, exemplary embodiments of the present invention provide a semiconductor memory device having a redundancy memory block and a cell array structure thereof. The redundancy efficiency can increase, even with a reduction of design overhead. In the exemplary embodiment, additional data, decoding, and control bussing for the redundancy memory block are not needed.

According to an exemplary embodiment of the present invention, a semiconductor memory device including a plurality of sub-mats or sub-banks constituting a memory cell array, is characterized in that each of the plurality of sub-mats comprises a plurality of normal memory blocks of which each includes a plurality of normal memory cells that are disposed adjacent one another; and at least one redundancy memory block having the same structure as the normal memory block, the at least one redundancy memory block being disposed adjacent at least one of the plurality of normal memory blocks and having a plurality of redundancy memory cells for row and column repairs.

The plurality of normal memory blocks and the at least one redundancy memory block may share a data line, a decoded line, and a control line.

Each of the plurality of sub-mats may comprise one normal main row decoder for generating a normal main word line signal through a decoding, and a plurality of normal sub-row decoders respectively disposed between two normal memory blocks among the plurality of normal memory blocks, the plurality of normal sub-row decoders being for use in selecting at least one normal sub-word line in response to the normal main word line signal.

Each of the plurality of sub-mats may comprise a redundancy column decoder for decoding a column line of the redundancy memory block.

Each of the plurality of sub-mats may comprise a redundancy main row decoder and redundancy sub-row decoder for decoding a row line of the redundancy memory block.

In a row repair, the redundancy memory block may be mapped so that a block address and column address corresponding to the plurality of normal memory blocks become a row address of the redundancy memory block, and a portion of the row address of the plurality of normal memory blocks becomes a column address.

The redundancy main row decoder may transmit a normal main word line signal of the normal main row decoder as a redundancy main word line signal to the redundancy sub-row decoder in a column repair, and may transmit a redundancy decoded signal that is obtained by decoding the column address and block address corresponding to a repaired normal main word line, as a redundancy main word line signal, to the redundancy sub-row decoder in a row repair.

The redundancy main row decoder may comprise at least one address decoder for decoding the column address and the block address in the repair, and at least one multiplexer for selecting the normal main word line signal or redundancy decoded signal as the redundancy main word line signal according to the type of repair.

The redundancy column decoder may receive column repair information from a fuse box identifying a redundancy in the column repair, and repair a column line of a normal memory block by using a column line of the redundancy memory block. The redundancy column decoder may receive row repair information from a fuse box identifying a redundancy in the row repair, and may repair sub-word lines corresponding to a normal main word line of a normal memory block by using a column line of the redundancy memory block.

The semiconductor memory device may be an SRAM.

According to an exemplary embodiment of the present invention, a semiconductor memory device including a plurality of sub-mats constituting a memory cell array, is characterized in that each of the plurality of sub-mats comprises at least one first-unit mat including a given number of normal memory blocks of which each includes a given number of normal memory cells and that are disposed adjacent one another; and at least one second-unit mat having the given number of normal memory blocks and at least one redundancy memory block, the at least one redundancy memory block having the same structure as the normal memory block and being disposed adjacent at least one of the given number of normal memory blocks.

The given number of normal memory blocks and the at least one redundancy memory block included in the at least one second-unit mat may share a data line, a decoded line, and a control line.

Each of the sub-mats may comprise one normal main row decoder for generating a main word line signal through a decoding, and a plurality of normal sub-row decoders respectively disposed between two normal memory blocks among the plurality of normal memory blocks, the plurality of normal sub-row decoders selecting at least one sub-word line in response to the main word line signal.

The at least one second-unit mat may comprise a redundancy column decoder for decoding a column line of the redundancy memory block.

The at least one second-unit mat may comprise a redundancy main row decoder and a redundancy sub-row decoder for decoding a row line of the redundancy memory block.

In a row repair, the at least one redundancy memory block may be mapped so that a block address and column address corresponding to the plurality of normal memory blocks become a row address of the redundancy cell block and a portion of the row address of the plurality of normal memory blocks becomes a column address.

The redundancy main row decoder transmits a normal main word line signal of the normal main row decoder as a redundancy main word line signal to the redundancy sub-row decoder in a column repair, and transmits a redundancy decoded signal that is obtained by decoding the column address and block address corresponding to a repaired normal main word line, as a redundancy main word line signal, to the redundancy sub-row decoder in a row repair.

The redundancy main row decoder comprises at least one address decoder for decoding the column address and the block address in the repair, and at least one multiplexer for selecting the normal main word line signal or redundancy decoded signal as the redundancy main word line signal according to the type of repair.

The redundancy column decoder may receive column repair information from a fuse box identifying a redundancy in the column repair, and repair a column line of a normal memory block by using a column line of the redundancy memory block, and may receive row repair information from a fuse box identifying a redundancy in the row repair, and repair sub-word lines corresponding to a normal main word line of a normal memory block by using a column line of the redundancy memory block.

According to an exemplary embodiment of the present invention, a memory cell array structure for use in a semiconductor memory device including a plurality of sub-mats is characterized in that each of the plurality of sub-mats comprises a plurality of normal memory blocks provided as a group of a plurality of normal memory cells; and at least one redundancy memory block having the same structure as a normal memory block, and disposed adjacent at least one of the normal memory blocks.

According to exemplary embodiments of the present invention, the redundancy efficiency can increase and a design overhead for a memory cell array structure can decrease. Furthermore, additional data, decoding and control bussing for a redundancy memory block is not required.

BRIEF DESCRIPTION OF THE DRAWINGS

Exemplary embodiments of the present invention will be understood in more detail from the following descriptions taken in conjunction with the attached drawings, and wherein.

DETAILED DESCRIPTION OF EXEMPLARY EMBODIMENTS

Exemplary embodiments of the present invention will be described more fully hereinafter with reference to FIGS. 3 to 7, in which exemplary embodiments of the present invention are shown. This invention may, however, be embodied in many different forms and should not be construed as limited to the exemplary embodiments set forth herein. Rather these exemplary embodiments are provided so that this disclosure will be thorough and complete, and will fully convey the scope of the invention to those of ordinary skill in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 3 to 7. This invention may, however, be embodied in many different forms and should not be construed as being limited to the exemplary embodiments set forth herein; rather, these exemplary embodiments are provided so that this disclosure is thorough and complete, and conveys the concept of the invention to those of ordinary skill in the art.

Figure 3:
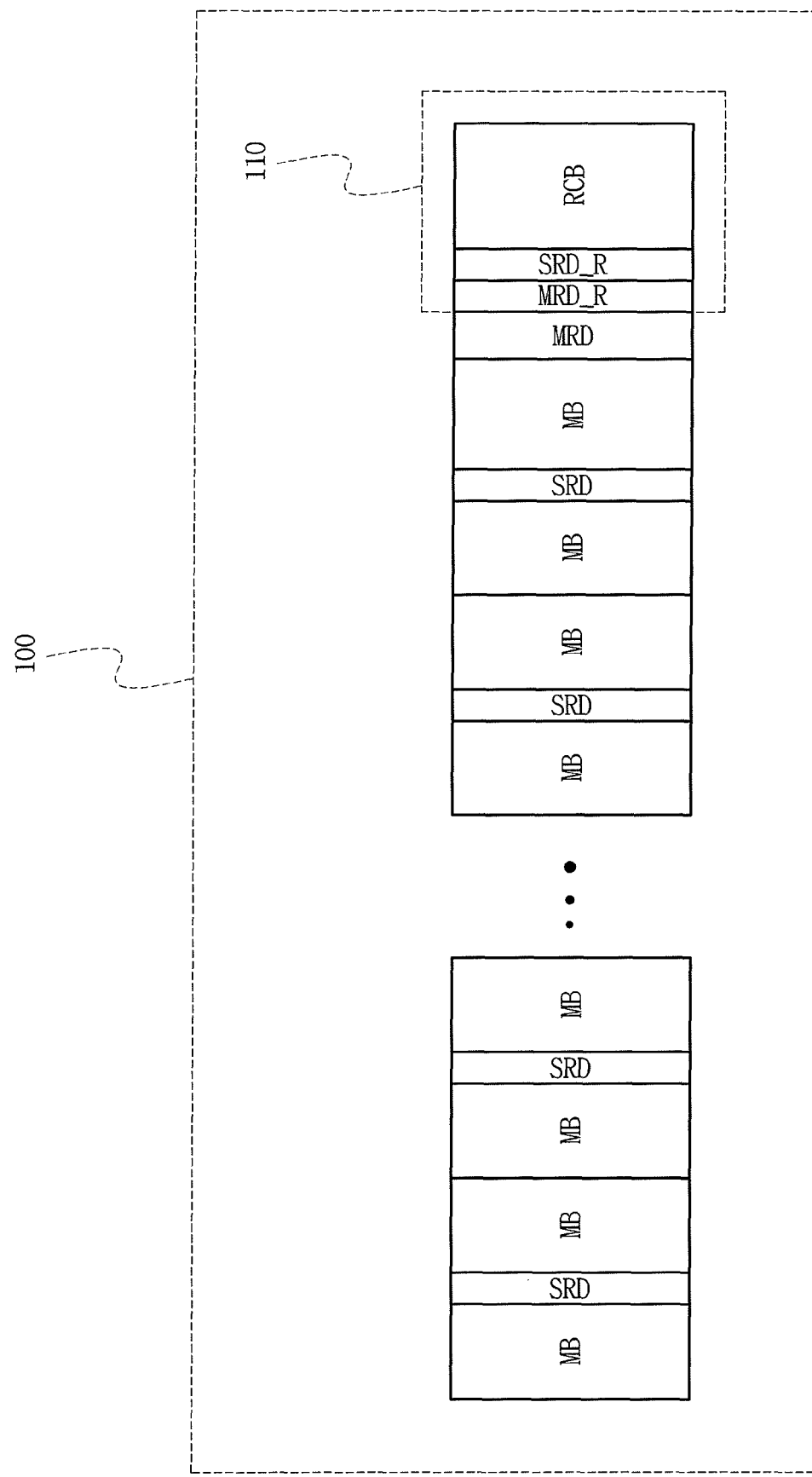
FIG. 3 illustrates a structure of a sub-mat in a semiconductor memory device according to an exemplary embodiment of the present invention.

FIG. 3 illustrates a structure of a sub-mat 100 constituting a portion of a memory cell array in a semiconductor memory device according to an exemplary embodiment of the present invention. The memory cell array comprises a plurality of memory mats of which each includes a plurality of sub-mats 100. As noted above, the memory mats may be referred to as memory banks and the sub-mats as sub-banks. Except for the structure of the sub-mat 100, the remaining configuration is the same as or similar to the configuration of a general semiconductor memory device.

Referring to FIG. 3, the sub-mat 100 of a semiconductor memory device according to an exemplary embodiment of the present invention comprises a plurality of normal memory blocks MB, a plurality of normal sub-row decoders SRD, one normal main row decoder MRD, a redundancy memory block RCB, a redundancy sub-row decoder SRD_R, and a redundancy main row decoder MRD_R. In this exemplary embodiment, the redundancy memory block RCB, the redundancy sub-row decoder SRD_R, and the redundancy main row decoder MRD_R are commonly referred to as a redundancy block 110.

The configuration and layout structure of the plurality of normal memory blocks MB, the plurality of normal sub-row decoders SRD, and the one normal main row decoder MRD are the same as or similar to a general semiconductor memory device. That is, the plurality of normal memory blocks MB are arrayed in line adjacent one another, respectively interposing a normal sub-row decoder SRD therebetween, and the normal main row decoder MRD is disposed near an edge of the normal memory block MB arranged at the end of the line.

In this structure one normal main word line MWL (not shown) is selected by the normal main row decoder MRD and at least one normal sub-word line SWL (not shown) is enabled by a normal sub-row decoder SRD responding to a signal provided through the normal main word line MWL. Though not shown in the drawing, related-circuits, including a normal column decoder to enable a column line (or bit line), are disposed for each of the normal memory blocks.

The redundancy memory block RCB within the redundancy block 110 may have the same structure as the general normal memory blocks MB. In other words, except for the characteristic that memory cells provided within redundancy memory block RCB are used to repair normal memory cells, the redundancy memory block RCB has the same structure as the normal memory block MB.

The redundancy block 110 may be disposed adjacent the normal main row decoder MRD. On the other hand, the redundancy block 110 may be disposed adjacent any one of the plurality of normal memory blocks MB. In the redundancy block 110, the redundancy main row decoder MRD_R, and the redundancy sub-row decoder SRD_R may be disposed to decode a row line of the redundancy memory block RCB. A redundancy column decoder YMDEC, shown in FIG. 4, may be further adapted to decode a column line of the redundancy memory block RCB.

Although the redundancy block 110 is represented with the configuration of being included in the sub-mat 100 according to an exemplary embodiment of the present invention, the sub-mat 100 may be constructed of only a normal memory block as in the conventional art and then it may be represented as the configuration of adding the redundancy block 110 to the sub-mat 100. As another exemplary configuration, any one of a plurality of memory blocks constituting the sub-mat 100 may be selected to constitute the redundancy memory block. Such configuration exemplary embodiments are included in the range of the present invention.

The plurality of normal memory blocks MB and the at least one redundancy memory block RCB may share a data line, a decoded line, and a control line. Because the redundancy memory block RCB has the same structure as the normal memory block MB and is disposed adjacent a specific normal memory block MB, it is therefore available to share a data line, a decoded line, and a control line.

Figure 4:
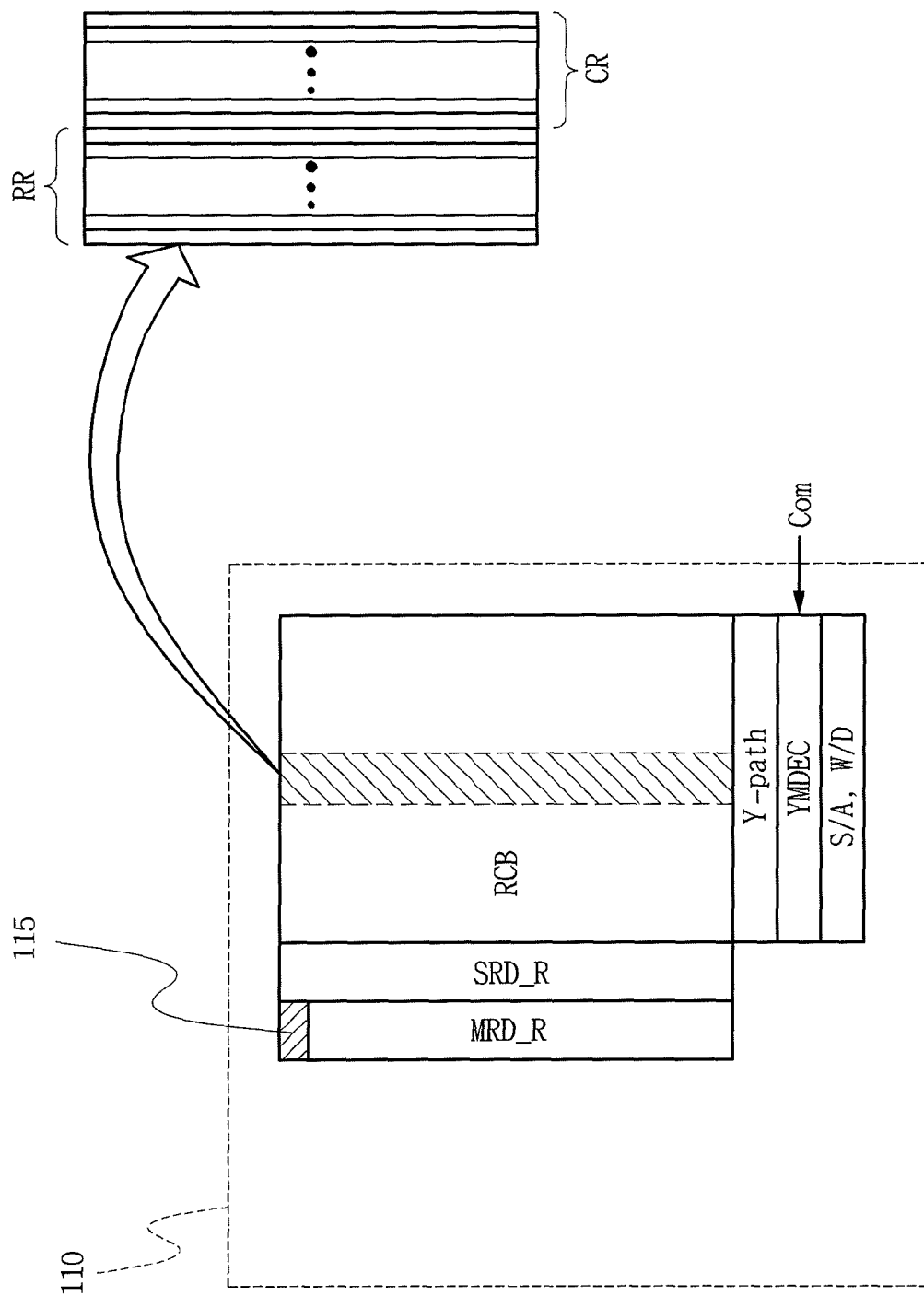
FIG. 4 illustrates an enlarged configuration of a redundancy block shown in FIG. 3.
Figure 5:
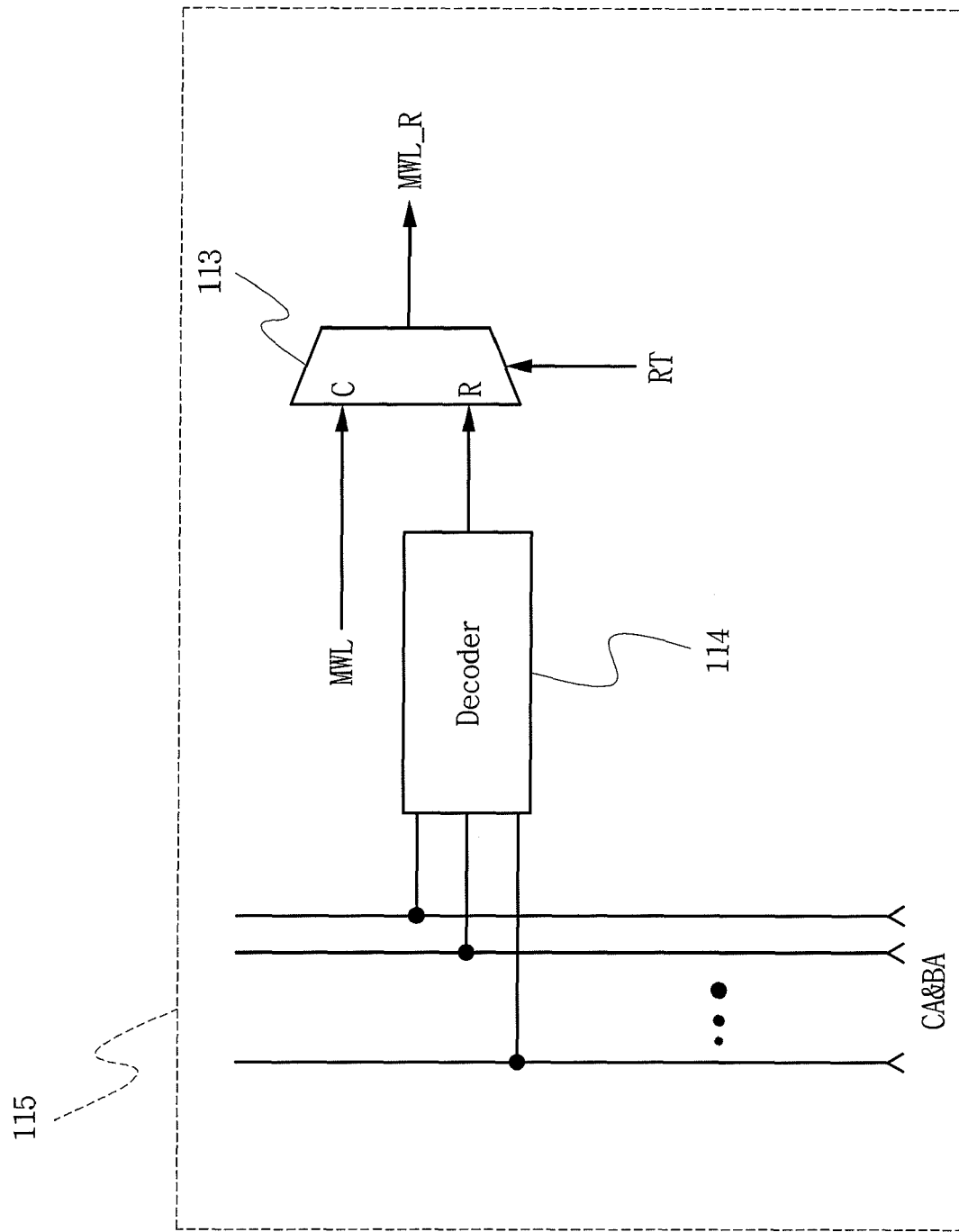
FIG. 5 illustrates an enlarged configuration for a portion of a redundancy main row decoder shown in FIG. 4.

FIGS. 4 and 5 illustrate the operation and configuration of the redundancy block 110 shown in FIG. 3. FIG. 4 provides a detailed configuration of the redundancy block 110, and FIG. 5 is a block diagram illustrating an enlarged portion of the redundancy main row decoder MRD_R shown in FIG. 4.

As shown in FIGS. 4 and 5, the redundancy block 110 comprises a redundancy memory block RCB, a redundancy main row decoder MRD_R, a redundancy sub-row decoder SRD_R, and a sense amplifier S/A and write driver W/D for a read and write operation performed after the repair. Also, a path circuit Y-path and redundancy column decoder YMDEC for the repair of a column line are included.

The configuration and operation of the path circuit Y-path, sense amplifier S/A, and writer driver W/D are known to those of ordinary skill in the art, and thus the description therefore is omitted.

As described above, the redundancy memory block RCB has the same structure as the normal memory block MB. In the redundancy memory block RCB, some column lines may be provided for a row repair RR, and the other column lines may be provided for a column repair CR. A row repair rate and a column repair rate may be fixed or changed according to the specific need.

As shown in FIG. 5, a portion 115 of the redundancy main decoder MRD_R comprises a redundancy address decoder 114 and a multiplexer 113.

The redundancy address decoder 114 generates a redundancy decoded signal obtained by decoding a column address CA and a block address BA corresponding to a repaired normal main word line.

The multiplexer 113 operates in response to a repair type signal RT informing of the particular type of repair. When the repair type signal RT indicates a column repair state C, that is, in a column repair case, the multiplexer 113 transmits the normal main word line signal MWL of the normal main row decoder MRD as the redundancy main word line signal MWL_R to the redundancy sub-row decoder SRD_R. When the repair type signal RT indicates a row repair state R, in a row repair case, the multiplexer 113 transmits the redundancy decoded signal as the redundancy main word line signal MWL_R to the redundancy sub-row decoder SRD_R shown in FIG. 4.

The redundancy sub-row decoder SRD_R selects at least one row line adapted within the redundancy memory block RCB in response to a redundancy main word line signal MWL_R and a normal main word line signal MWL provided from the redundancy main row decoder MRD_R. The redundancy sub-row decoder SRD_R may have the same structure as the normal sub-row decoder SRD.

Like the normal sub-row decoder SRD performing in response to the main word line signal MWL, the redundancy sub-row decoder SRD_R performs an operation of selecting a corresponding row line in response to the redundancy main word line signal MWL_R.

In brief, in a row repair, the redundancy memory block RCB may be mapped so that a block address BA and column address CA corresponding to the plurality of normal memory blocks MB become a row address of the redundancy memory block RCB, and a portion of the row address of the plurality of normal memory blocks MB becomes a column address.

The redundancy column decoder YMDEC may receive column repair information Com from a fuse box identifying a redundancy in a column repair, and may repair a defective column line of a normal memory block MB by using a column line of the redundancy memory block RCB. In this case, the redundancy main word line signal MWL_R is the same signal as the normal main word line signal MWL.

The redundancy memory block RCB and the normal memory blocks MB share a decoded line, a data line and a control line. The normal memory block MB has the same structure as the redundancy memory block RCB. When normal main word line signal MWL is input as a redundancy main word line signal MWL_R, the redundancy sub-row decoder SRD_R operates the same as a general normal sub-row decoder SRD_R, and a row line of the same position as a normal operation is selected. Thus, when a column line is repaired using the redundancy column decoder YMDEC, defective cells within the normal memory block MB are automatically mapped with redundancy memory cells within the redundancy memory block RCB.

The row repair case, however, may be complicated unlike what is explained above. In the row repair, the redundancy column decoder YMDEC receives row repair information Com from the fuse box having information regarding a defective address, that is, the redundancy address. The fuse box is adapted in a semiconductor memory device for performing a redundancy, and the configuration and operation thereof are known to those of ordinary skill in the art.

The redundancy column decoder YMDEC repairs sub-word lines SWL corresponding to a main word line MWL of the normal memory block MB by using a column line of the redundancy memory block RCB. When one column line is insufficient, a plurality of column lines may be used for the repair. In other words, a row line of the normal memory block MB is repaired with a column line of the redundancy memory block RCB. The column address CA and block address BA for the defective cell are decoded by the redundancy address decoder 114 of the redundancy main row decoder MRD_R, and so the repair is performed by using a row line of the redundancy memory block RCB.

That is, the redundancy memory block RCB may be mapped so that the block address BA and column address CA corresponding to the plurality of normal memory blocks MB become a row address of the redundancy memory block RCB, and a portion of the row address of the plurality of normal memory blocks MB becomes a column address, which corresponds to a row repair case.

In addition, in memory cells of the redundancy memory block RCB, a row versus column repair rate is not fixed, but its rate can be freely decided. For that, a specific control unit (not shown) is needed to define the repair rate according to a rate of defective column line and row line. This can be obtained by changing an address input to the redundancy block RCB.

The repair steps are described in more detail in connection with the following examples.

It may be first assumed that the sub-mat 100 includes sixteen normal memory blocks MB and one normal memory block MB has a structure with eight I/O on 512 row lines and 32 column lines per one I/O. In this example, the number of column lines within one normal memory block are '32*8=256'. And one redundancy memory block RCB is configured with the same structure as the normal memory blocks MB. The redundancy memory block RCB is in charge of a repair for defective cells within all normal memory blocks MB constituting the sub-mat 100. The column versus row repair rate of the redundancy memory block RCB is assumed herein as 1:1.

In this case, a row address of nine bits is required for a row decoding of the normal memory block MB, and for a column decoding, a column address of five bits is needed. Furthermore, four bits are needed as the block address. It is therefore very important to precisely map addresses corresponding to defective cells of the normal memory block MB to the redundancy memory block RCB in performing the repair. A row decoding and a column decoding therefore are described as follows.

As described above, the row decoding is performed through the redundancy main row decoder MRD_R in the row repair. At this time, normal column address of five bits and normal block address of four bits are used in the row decoding. And, for a row decoding in the column repair, normal row address of nine bits is used equally to the row decoding of the normal memory block MB. It is selected herein by the repair type signal RT transmitted from the fuse box whether to use a normal row address or a normal column address and normal block address, so as to perform the row decoding.

Then, a column decoding is performed in the redundancy column decoder YMDEC with defective cell information Com transmitted from the fuse box instead of using the normal column address of five bits. That is, in the row repair, at least one sub-word line SWL of the plurality of normal memory blocks MB is repaired with a column line of the redundancy memory block RCB by using the information Com from the fuse box. In the column repair, a defective column line of the normal memory block MB is repaired with a column line of the redundancy memory block RCB by using the information Com from the fuse box.

Figure 6:
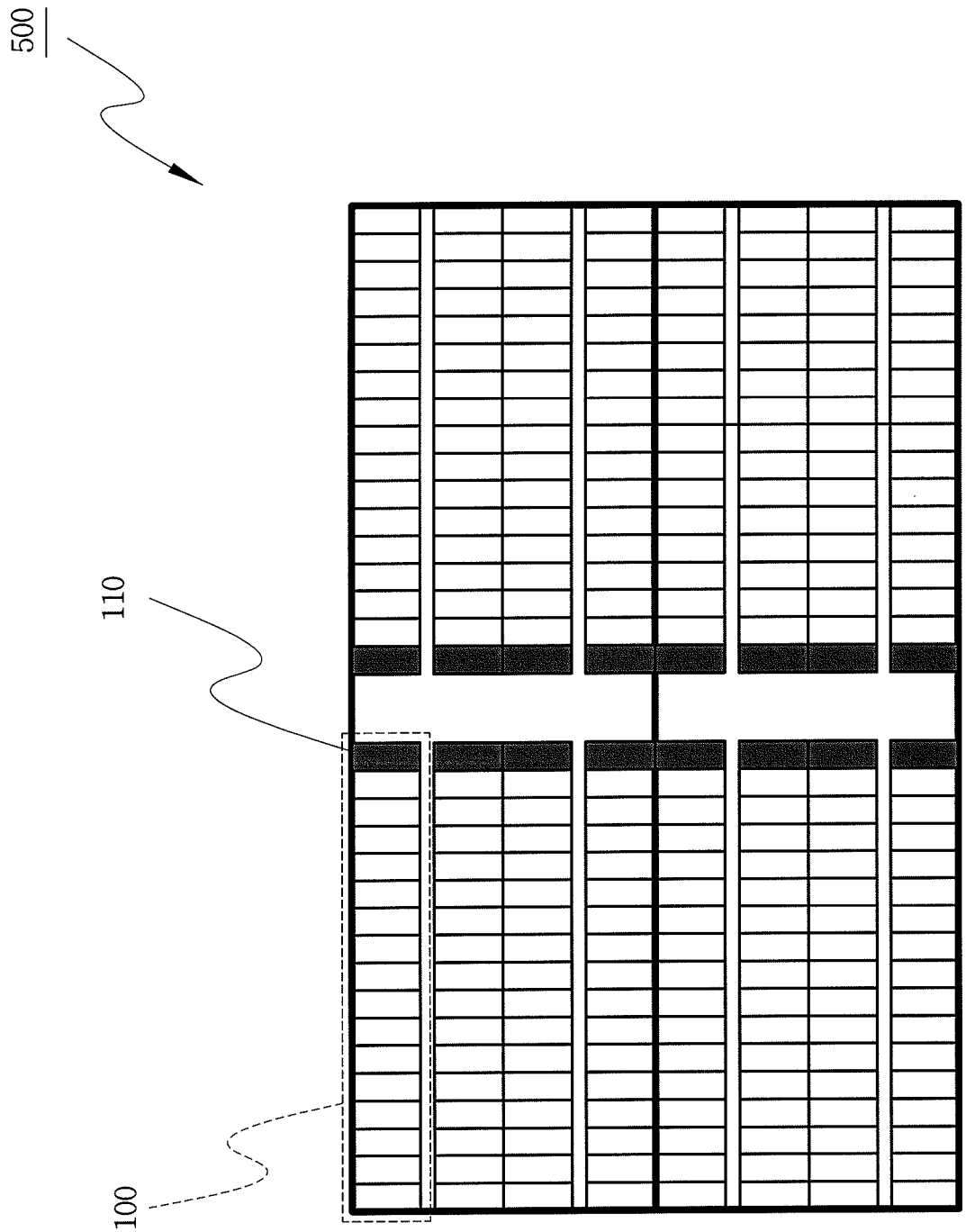
FIGS. 6 and 7 illustrate examples of a memory cell array structure including at least one sub-mat having a structure as shown in FIGS. 3 to 5.
Figure 7:
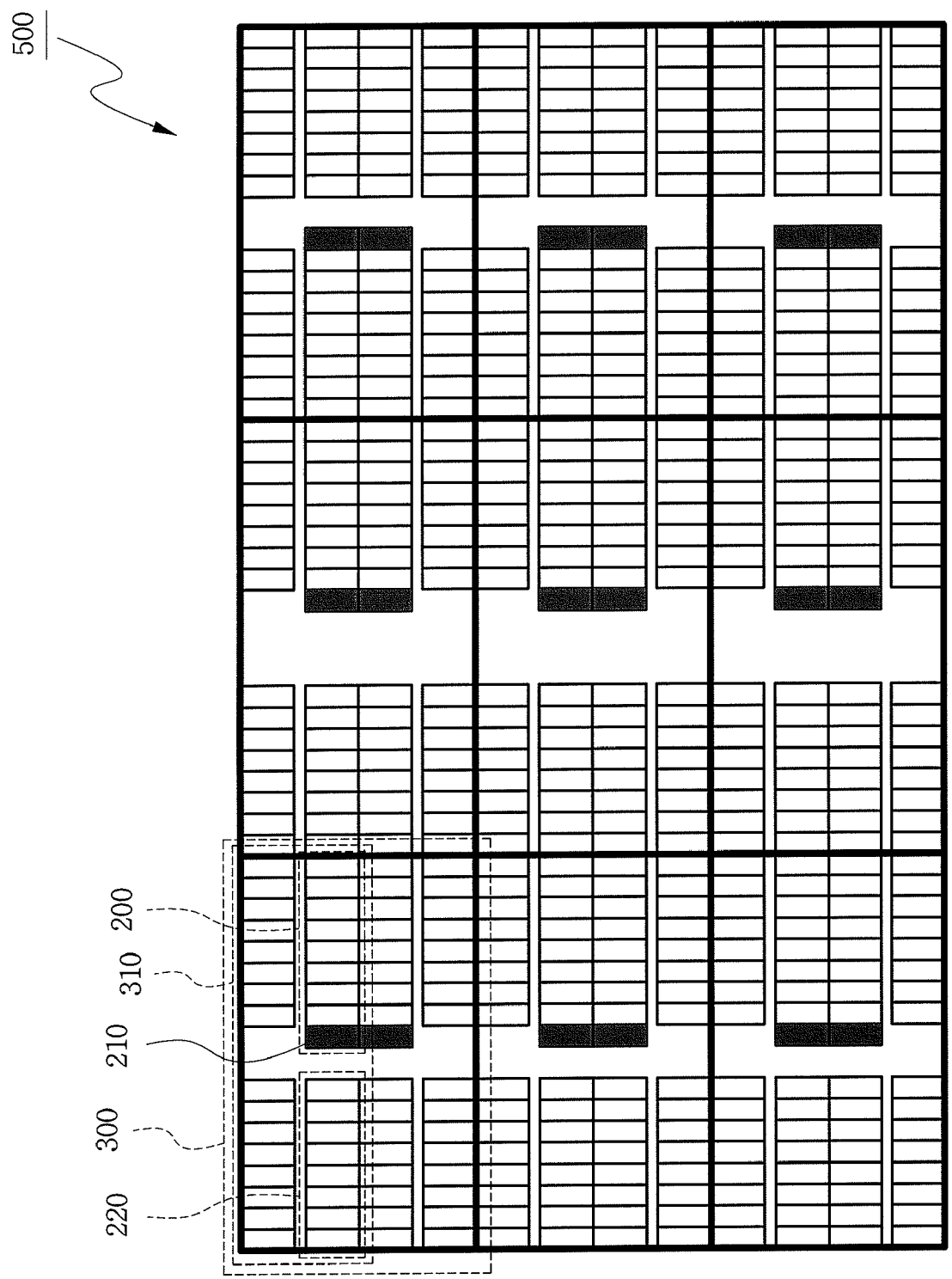

FIGS. 6 and 7 illustrate exemplary embodiments of a memory cell array structure 500 including at least one sub-mat having a structure as shown in FIGS. 3 to 5.

As shown in FIG. 6, the cell array structure 500 of a semiconductor memory device according to an exemplary embodiment of the present invention includes a plurality of sub-mats 100 described above referring to FIGS. 3 to 5. In this case, all the plurality of sub-mats 100 have at least one redundancy block 110.

As shown in FIG. 7, the memory cell array 500 of a semiconductor memory device according to an exemplary embodiment of the present invention has a structure employing nine memory mats. An exemplary embodiment of an internal structure of an optional memory mat 300 among the memory mats is described as follows. The memory mat 300 comprises at least two sub-mats. An optional sub-mat 310 of the sub-mats comprises at least one first-unit mat 220 and at least one second-unit mat 200. For example, the sub-mat 310 may comprise two first-unit mats 220 and one second-unit mat 200.

When at least one first-unit mat 220 and one second-unit mat 200 constituting the sub-mat 310 are adjacent each other, a data line, and another control line are shared by them.

Figure 1:
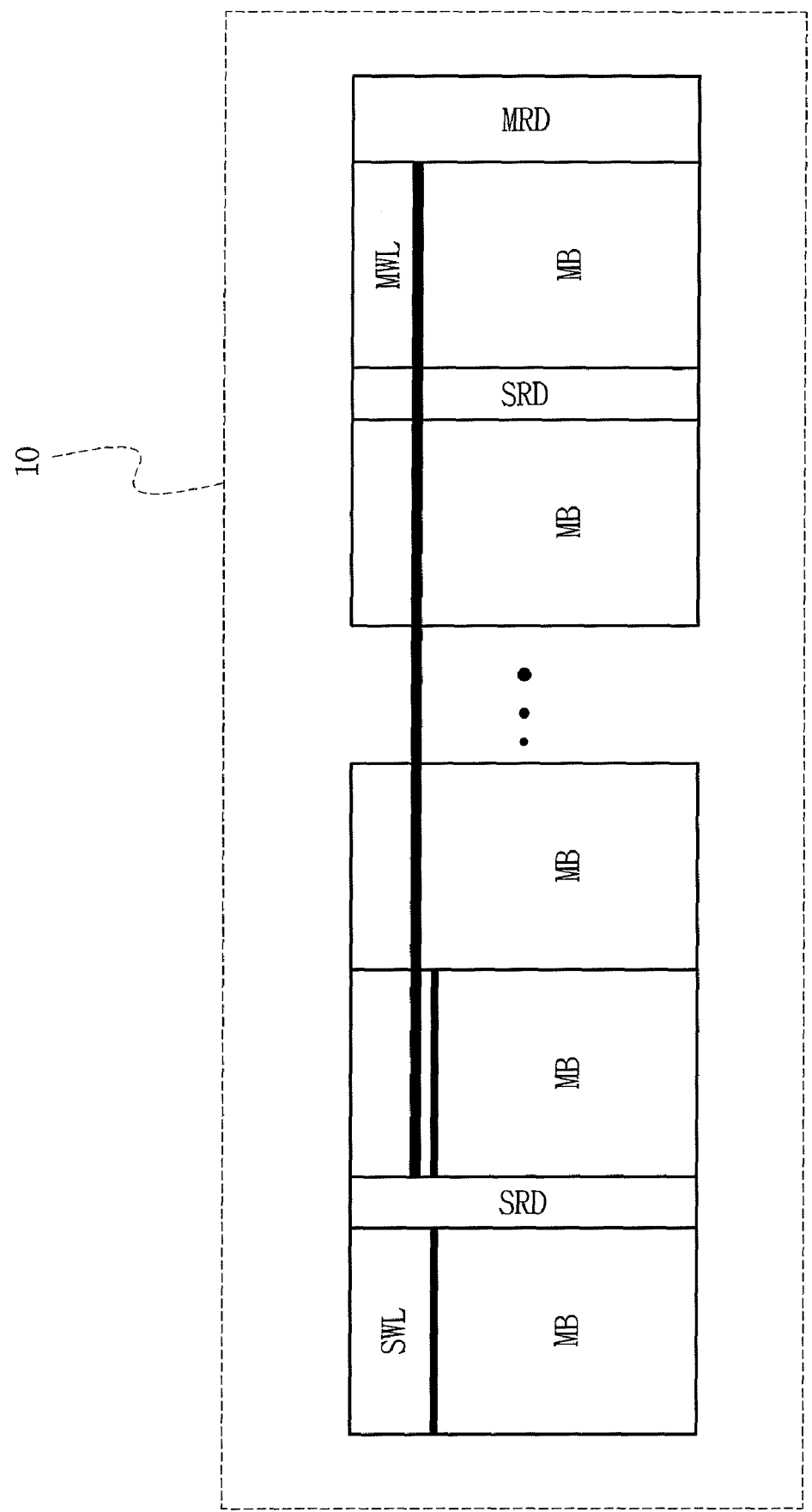
FIG. 1 illustrates a structure of a sub-mat in a semiconductor memory device according to a conventional art.
Figure 2:
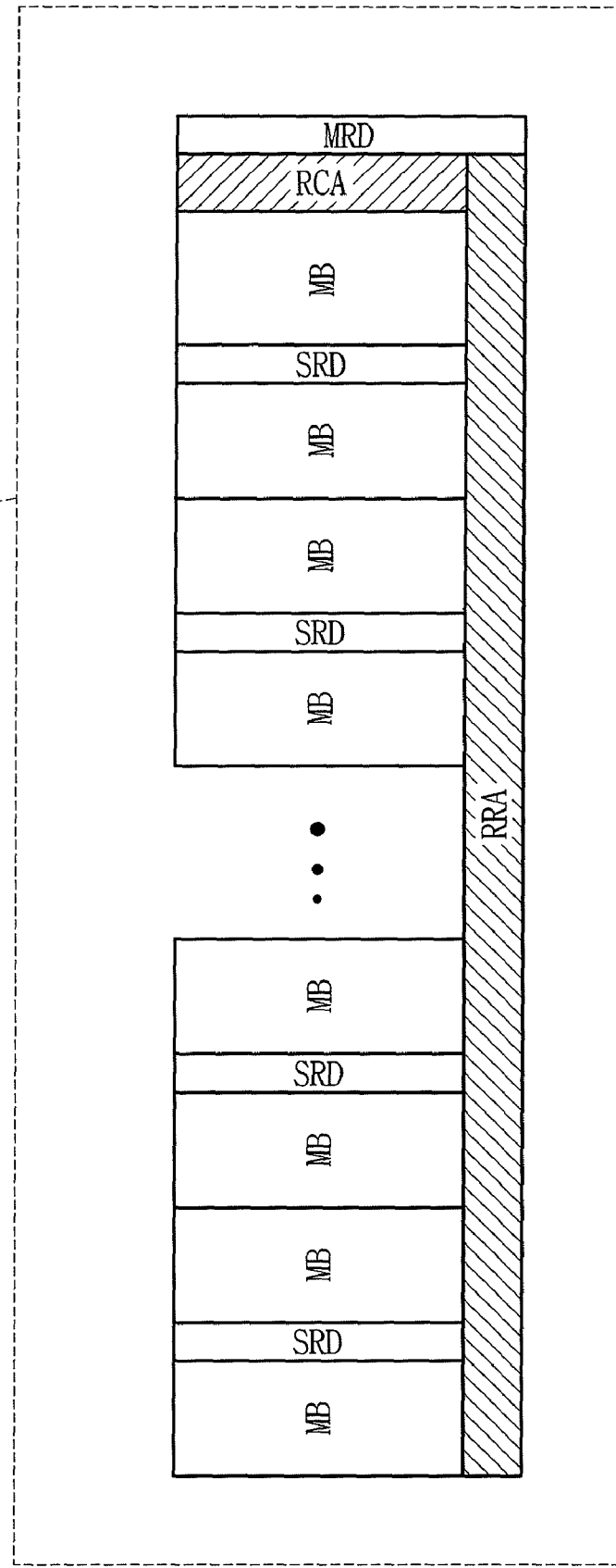
FIG. 2 illustrates a structure of a sub-mat with a redundancy area according to a conventional art.

The first-unit mat 220 is provided to include normal memory blocks MB, without including the redundancy block 110 described with reference to FIGS. 3 to 5, and has a structure similar to the sub-mat 10 of FIG. 1.

In the first-unit mat 220, however, the number of normal memory blocks MB may be less than the sub-mats 10 described with reference to FIG. 1.

The second-unit mat 200 has the same structure as the first-unit mat 220 except that the second-unit mat 200 further includes at least one redundancy block 210. In this exemplary embodiment, the number of normal memory blocks MB adapted for use in the first-unit mat 220 and the number of normal memory blocks MB adapted for use in the second-unit mat 200 may be equal to each other. The structure of redundancy memory block 210 is as described above with reference to FIGS. 3 to 5.

Although in FIGS. 6 and 7, the memory cell array structure of a semiconductor memory device according to an exemplary embodiment of the present invention is described above using two examples, the memory cell array may be configured diversely. For example, in FIG. 7 the configuration rate of the first and second unit mats 220 and 200 may be controlled diversely.

As described above, according to exemplary embodiments of the exemplary invention, an effective repair can be performed and a design overhead for a memory cell array structure can be reduced. Additionally, there is the advantage of not requiring additional data, decoding and control bussing for a redundancy memory block.

The semiconductor memory device according to exemplary embodiments of the present invention is generally applied to an SRAM, including an embedded SRAM, but may be applied to other semiconductor memory devices with some changes or applications.

It will be seen by those of ordinary skill in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

In the drawings and specification, there have been disclosed embodiments of the present invention and, although specific terms are employed, they are used in a generic and descriptive sense only and not for purposes of limitation, the scope of the invention being set forth in the following claims.

What is claimed is:

1. A semiconductor memory device including a plurality of sub-mats constituting a memory cell array, wherein each of the plurality of sub-mats comprises:
   a plurality of normal memory blocks, each including a plurality of normal memory cells disposed adjacent one another; and
   at least one redundancy memory block having the same structure as each of the plurality of normal memory blocks, the at least one redundancy memory block being disposed adjacent at least one of the plurality of normal memory blocks and having a plurality of redundancy memory cells for use in making a row and column repair,
   wherein in a row repair, the redundancy memory block is mapped so that a block address and a column address corresponding to the plurality of normal memory blocks become a row address of the redundancy memory block and a portion of a row address of the plurality of normal memory blocks becomes a column address.

2. The device of claim 1, wherein the plurality of normal memory blocks and the at least one redundancy memory block share a data line, a decoded line, and a control line.

3. The device of claim 2, wherein each of the plurality of sub-mats comprises one normal main row decoder for generating a normal main word line signal through a decoding, and a plurality of normal sub-row decoders respectively disposed between two normal memory blocks among the plurality of normal memory blocks, the plurality of normal sub-row decoders being for selecting at least one normal sub-word line in response to the normal main word line signal.

4. The device of claim 3, wherein each of the plurality of sub-mats further comprises a redundancy column decoder for decoding a column line of the redundancy memory block.

5. The device of claim 4, wherein each of the plurality of sub-mats further comprises a redundancy main row decoder and a redundancy sub-row decoder for decoding a row line of the redundancy memory block.

6. The device of claim 5, wherein the redundancy main row decoder transmits a normal main word line signal of the normal main row decoder as a redundancy main word line signal to the redundancy sub-row decoder in a column repair, and transmits a redundancy decoded signal that is obtained by decoding the column address and block address corresponding to a repaired normal main word line, as a redundancy main word line signal, to the redundancy sub-row decoder in a row repair.

7. The device of claim 6, wherein the redundancy main row decoder comprises at least one address decoder for decoding the column address and the block address in the repair, and at least one multiplexer for selecting the normal main word line signal or redundancy decoded signal as the redundancy main word line signal according to a repair type.

8. The device of claim 7, wherein the redundancy column decoder receives column repair information from a fuse box identifying a redundancy in the column repair, and repairs a column line of normal memory block by using a column line of the redundancy memory block, and receives row repair information from a fuse box identifying a redundancy in the row repair, and repairs sub-word lines corresponding to a normal main word line of a normal memory block by using a column line of the redundancy memory block.

9. The device of claim 8, wherein the semiconductor memory device is an SRAM (Static Random Access Memory).

10. A semiconductor memory device including a plurality of sub-mats constituting a memory cell array, wherein each of the plurality of sub-mats comprises:
- at least one first-unit mat including a given number of normal memory blocks, each including a given number of normal memory cells disposed adjacent one another; and
- at least one second-unit mat having the given number of normal memory blocks and at least one redundancy memory block, the at least one redundancy memory block having the same structure as the normal memory block and being disposed adjacent at least one of the given number of normal memory blocks,
- wherein in a row repair, the redundancy memory block is mapped so that a block address and a column address corresponding to the plurality of normal memory blocks become a row address of the redundancy memory block and a portion of a row address of the plurality of normal memory blocks becomes a column address.

11. The device of claim 10, wherein the given number of normal memory blocks and the at least one redundancy memory block included in the at least one second-unit mat share a data line, a decoded line, and a control line.

12. The device of claim 11, wherein each of the sub-mats comprises one normal main row decoder for generating a main word line signal through a decoding, and a plurality of normal sub-row decoders respectively disposed between two normal memory blocks among the plurality of normal memory blocks, the plurality of normal sub-row decoders being for selecting at least one sub-word line in response to the main word line signal.

13. The device of claim 12, wherein the at least one second-unit mat comprises a redundancy column decoder for decoding a column line of the redundancy memory block.

14. The device of claim 13, wherein the at least one second-unit mat comprises a redundancy main row decoder and a redundancy sub-row decoder for decoding a row line of the redundancy memory block.

15. The device of claim 14, wherein the redundancy main row decoder transmits a normal main word line signal of the normal main row decoder as a redundancy main word line signal to the redundancy sub-row decoder in a column repair, and transmits a redundancy decoded signal that is obtained by decoding the column address and the block address corresponding to a repaired normal main word line, as a redundancy main word line signal, to the redundancy sub-row decoder in a row repair.

16. The device of claim 15, wherein the redundancy main row decoder comprises at least one address decoder for decoding the column address and the block address in the repair, and at least one multiplexer for selecting the normal main word line signal or redundancy decoded signal as the redundancy main word line signal according to a repair type.

17. The device of claim 16, wherein the redundancy column decoder receives column repair information from a fuse box identifying a redundancy in the column repair, and repairs a column line of normal memory block by using a column line of the redundancy memory block, and receives row repair information from a fuse box identifying a redundancy in the row repair, and repairs sub-word lines corresponding to a normal main word line of normal memory block by using a column line of the redundancy memory block.

18. A memory cell array structure for use in a semiconductor memory device including a plurality of sub-mats, wherein each of the plurality of sub-mats comprises:
- a plurality of normal memory blocks each provided with a group of a plurality of normal memory cells; and
- at least one redundancy memory block having the same structure as a normal memory block, and disposed adjacent at least one of the normal memory blocks,
- wherein in a row repair, the redundancy memory block is mapped so that a block address and a column address corresponding to the plurality of normal memory blocks become a row address of the redundancy memory block and a portion of a row address of the plurality of normal memory blocks becomes a column address.

* * * * *